(12) United States Patent
Brener et al.

(10) Patent No.: US 9,705,311 B1
(45) Date of Patent: Jul. 11, 2017

(54) MID-INFRARED TUNABLE METAMATERIALS

(75) Inventors: Igal Brener, Albuquerque, NM (US);
Xiaoyu Miao, Sunnyvale, CA (US);
Eric A. Shaner, Rio Rancho, NM (US);
Brandon Scott Passmore, Fayetteville, AR (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 846 days.

(21) Appl. No.: 12/965,659

(22) Filed: Dec. 10, 2010

Related U.S. Application Data

(60) Provisional application No. 61/286,560, filed on Dec. 15, 2009.

(51) Int. Cl.
*H01L 31/02* (2006.01)
*H02H 7/26* (2006.01)
*H01L 31/0264* (2006.01)

(52) U.S. Cl.
CPC .............. *H02H 7/262* (2013.01); *H01L 31/02* (2013.01); *H01L 31/0264* (2013.01)

(58) Field of Classification Search
CPC ...... H02H 7/262; H01L 31/02; H01L 31/0264
USPC ........................................................... 257/5
See application file for complete search history.

(56) References Cited

U.S. PATENT DOCUMENTS

2006/0109541 A1* 5/2006 Osipov et al. ................ 359/321

OTHER PUBLICATIONS

Dicken, Frequency tunable near-infrared metamaterials based are VO2 phase transition, Optics Express; Sep. 26, 2009. vol. 17, No. 20, 18332-18339.
Chen, Hou-Tong, A metamaterial solid-state terahertz phase modulator, Nature Photonics, vol. 3, Mar. 2009.
Chen, Hou-Tong, Active terahertz metamaterial devices, Nature Letters, vol. 444, Nov. 30, 2006, 597-600.
Chen, Hou-Tong, A metamaterial solid-state terahertz modulator, Nature Letters, vol. 3, Mar. 2009.
Chen, Hou-Tong, Active Terahertz Metamaterials1, Optics and Spectroscopy, vol. 108, No. 6, 2010, 834-840.
Driscoll, T., Memory Metamaterials, Science, Sep. 18, 2009, vol. 235, 1518-1521.
Driscoll, T., Dynamic tuning of an infrared hybrid-metamaterial resonance using vanadium dioxide, Applied Physics Letters, 93, 024101-1 to 024101-3 (2008).
E. Litwin-Staszewska, The Electron Mobility and Thermoelectric Power in InSb at Atmospheric and Hydrostatic Pressures, Phys. stat. sol. (b) 105, 551-559 (1981).

(Continued)

*Primary Examiner* — Matthew Reames
(74) *Attorney, Agent, or Firm* — Kevin W. Bieg

(57) ABSTRACT

A mid-infrared tunable metamaterial comprises an array of resonators on a semiconductor substrate having a large dependence of dielectric function on carrier concentration and a semiconductor plasma resonance that lies below the operating range, such as indium antimonide. Voltage biasing of the substrate generates a resonance shift in the metamaterial response that is tunable over a broad operating range. The mid-infrared tunable metamaterials have the potential to become the building blocks of chip based active optical devices in mid-infrared ranges, which can be used for many applications, such as thermal imaging, remote sensing, and environmental monitoring.

9 Claims, 4 Drawing Sheets

(56) References Cited

OTHER PUBLICATIONS

Pekka M. T. Ikonen, Determination of Generalized Permeability Function and Field Energy Density in Artificial Magnetics Using the Equivalent-Circuit Method, IEEE Transactions on Microwave Theory and Techniques, vol. 55, No. 1, Jan. 2007, 92-99.
S. Linden, Magnetic Response of Metamaterials at 100 Terahertz, Science, vol. 306, Nov. 19, 2004, 1351-1353.
Passmore, Mid-infrared doping tunable transmission through subwavelength metal hold arrays on InSb, Optics Express, Jun. 8, 2009, vol. 17, No. 12, 10223-10230.
Manzanares-Martinez, Temperature tuning of two-dimensional photonic crystals in the presence of phonons and a plasma of electrons and holes, Physical Review B 72, (2005) 035336-1 to 035336-9.
O'Hara, Thin-film sensing with planar terahertz metamaterials: sensitivity and limitations, Optics Express, Feb. 4, 2008, vol. 16, No. 3, 1786-1795.
Shelton, Effect of thin silicon dioxide layers on resonant frequency in infrared metamaterials, Optics Express, Jan. 18, 2010, vol. 18, No. 2, 1085-1090.
Zhang, Superlenses to overcome the diffraction limit, Nature Materials, vol. 7, Jun. 2008, 435-441.
Valentine, An optical cloak made of dielectric, Nature Materials, vol. 6, Jul. 2009, 568-571.
D. H. Werner, Liquid crystal clad near-infrared metamaterials with tunable negative-zero-positive refractive indices, Optics Express, Mar. 19, 2007, vol. 15, No. 6, 3342-3347.

* cited by examiner

MID-INFRARED TUNABLE METAMATERIALS

CROSS-REFERENCE TO RELATED APPLICATION

This application claims the benefit of U.S. Provisional Application No. 61/286,560, filed Dec. 15, 2009, which is incorporated herein by reference.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to electromagnetic metamaterials and, in particular, to metamaterials that are tunable in the mid-infrared portion of the electromagnetic spectrum.

BACKGROUND OF THE INVENTION

The ability of metamaterials to create artificial electromagnetic properties absent in nature has initiated intense research efforts for applications in frequency selective surfaces, sub-diffraction imaging, cloaking, and etc. See S. Linden et al., "Magnetic response of metamaterials at 100 terahertz," *Science* 306, 1351 (2004); X. Zhang, and Z. Liu, "Superlenses to overcome the diffraction limit," *Nature Materials* 7, 435 (2008); and J. Valentine et al., "An optical cloak made of dielectrics," *Nature Materials* 8, 568 (2009). The development of tunable metamaterials, which allow for real-time tuning of the electromagnetic response, is emerging as an important sub-topic in this field. Tunable metamaterials have the potential to become the building blocks of chip-based active optical devices, and as optical switches, modulators, and phase shifters. A typical way to make such tunable metamaterials is to integrate a natural reconfigurable material in the metamaterial structure and apply an external stimulus to achieve tuning. For example, tunable metamaterials have been demonstrated using electrical reorientation in liquid crystals and thermally/electrically induced insulator-to-metal phase transition in vanadium dioxide ($VO_2$). See D. H. Werner et al., "Liquid crystal clad near-infrared metamaterials with tunable negative-zero-positive refractive indices," *Optics Express* 15, 3342 (2007); M. J. Dicken et al., "Frequency tunable near-infrared metamaterials based on $VO_2$ phase transition," *Optics Express* 17, 18330 (2009); T. Driscoll et al., "Dynamic tuning of an infrared hybrid-metamaterial resonance using vanadium dioxide," *Applied Physics Letter* 93, 024101 (2008); and T. Driscoll et al., "Memory Metamaterials," *Science* 325, 1518 (2009).

Recently, active terahertz metamaterials based on variants of split-ring resonators (SRRs) on a doped gallium arsenide (GaAs) substrate have been realized by dynamically changing the carrier concentration of the underlying semiconductor using an electric bias voltage, which effectively tunes the strength of the resonance, producing an amplitude modulation effect or a phase modulation. This amplitude modulation is a result of "shunting" due to the presence of carriers in the doped substrate. See H.-T. Chen et al., "Active terahertz metamaterial devices," *Nature* 444, 597 (2006); H.-T. Chen et al., "A metamaterial solid-state terahertz phase modulator," *Nature Photonics* 3, 148 (2009); and U.S. Pat. No. 7,826,504 to Chen et al. However, all of these references disclose electrically tunable metamaterials at only terahertz frequencies (i.e., 0.1-3 THz).

Therefore, a need remains for a metamaterial that is tunable in a higher (e.g., infrared) spectral range.

SUMMARY OF THE INVENTION

The present invention is directed to a tunable metamaterial, comprising a doped semiconductor substrate having a large dependence of dielectric function on the carrier concentration and a semiconductor plasma resonance lying below an operating frequency range; an array of resonators on the doped semiconductor substrate; and an electrical circuit for applying a bias voltage between the doped semiconductor substrate and the resonator array for modulating the carrier concentration of the semiconductor substrate and tuning the resonance of the resonator array over the operating frequency range. In general, the resonator array can be tunable over a range of operating frequency range of 100 THz to 15 THz (wavelength range of 3-20 μm). For example, the semiconductor substrate comprises InSb, InAs, GaAs, GaSb, GaN, or Si that is doped n-type. In general, the resonator array can comprise a ring-like structure with one or multiple splits or a wire-like structure in a connected arrangement, such as a split-ring resonator, a cut-wire pair, or a fishnet-like structure, that is scalable through most of the short- to long-infrared. For example, the resonator elements can comprise split-ring resonators that are tunable over an operating range of 37.5 THz to 25 THz (wavelength range of 8 to 12 μm). The metamaterial can further comprise a gate dielectric layer, such as $HfO_2$ or $SiO_2$, between the resonator array and the doped semiconductor substrate.

The mid-infrared tunable metamaterials have the potential to become the building blocks of chip based active optical devices in mid-infrared ranges, which can be used for many applications, such as thermal imaging, remote sensing, and environmental monitoring.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

Figure 1:
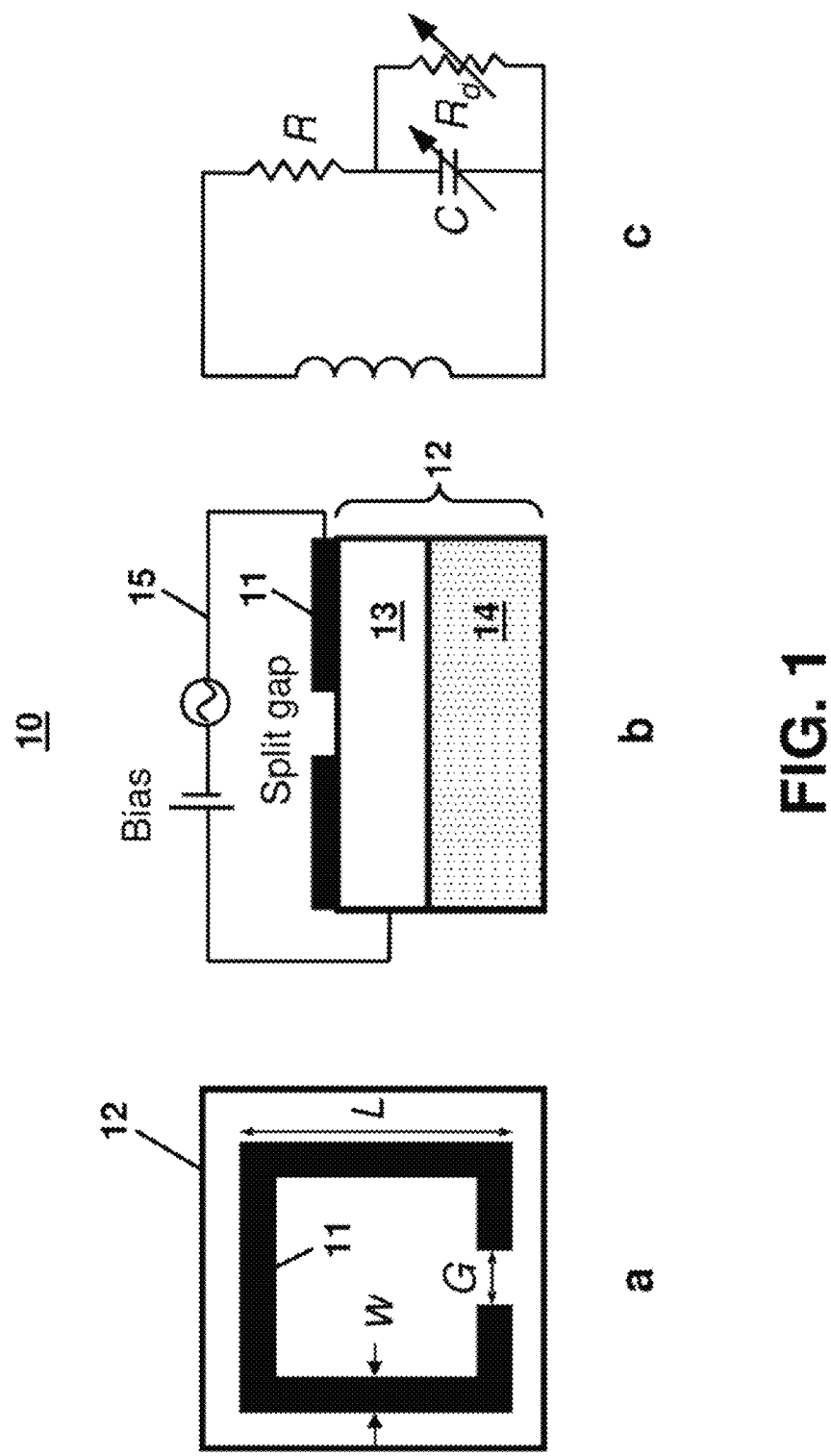
FIG. 1(a) is a top-view schematic illustration of a split-ring resonator (SRR) on a semiconductor substrate.
FIG. 1(b) is a side-view schematic illustration of the metamaterial. A voltage bias is applied between the metal resonator and doped semiconductor substrate to control the substrate carrier concentration.
FIG. 1(c) is an equivalent circuit of the electrically tunable metamaterial.

FIG. 1(a) shows a top-view schematic illustration of an exemplary SRR 11 on a semiconductor substrate 12. FIG. 1(b) is a side-view schematic illustration of an electrically tunable metamaterial 10. A voltage bias is applied by an electrical circuit 15 between the metal resonator 11 and the doped semiconductor substrate 12 to control the substrate carrier concentration. The doped semiconductor substrate 12 can comprise a doped layer 13 grown on a semi-insulating substrate 14. The metamaterial can further comprise an additional symmetric resonator on the backside of the doped layer or semiconductor substrate. In general, the tunable metamaterial can comprise an array of such resonators on the frontside and/or backside of the doped layer or semiconductor substrate.

As shown in FIG. 1(c), the resonance of a SRR on a semiconductor substrate can be explained by an equivalent circuit model, where the ring inductance is described by L, the split gap and fringing capacitance are denoted by C, the resistor R models the dissipation in the split rings, and the resistor $R_d$ models the dissipation due to the substrate free carrier absorption within the split gap (and in the regions in close proximity to the metal lines). See S. Linden et al., "Magnetic response of metamaterials at 100 terahertz," *Science* 306, 1351 (2004); and H.-T. Chen et al., "Active terahertz metamaterial devices," *Nature* 444, 597 (2006). When the metal lines act as gates, the underlying carrier concentration, in principle, can be changed by the application of an electrical bias affecting thus both $R_d$ and C. The resistance $R_d$ is inversely proportional to the AC conductivity of the doped semiconductor material due to free carrier losses. See P. Ikonen and S. Tretyakov, "Determination of generalized permeability function and field energy density in artificial magnetic using the equivalent-circuit method," *IEEE Transactions on Microwave Theory and Techniques* 55, 92 (2007). The capacitance C is related to the dielectric function of the semiconductor substrate due to the field lines fringing into the material. See L. I. Basilio et al., "Equivalent circuit models and optimization of a split-ring resonator," IEEE International Symposium on Antennas and Propagation and USNC-URSI National Radio Science Meeting (2009); and J. F. O'Hara et al., "Thin-film sensing with planar terahertz metamaterials: sensitivity and limitations," *Optics Express* 16, 1786 (2008). The resistance change in $R_d$ influences the resonance strength while the capacitance change in C shifts the resonance, frequency.

For terahertz tunable metamaterials, it is critical to choose a semiconductor substrate with the same plasma frequency as the resonance frequency of metamaterial resonator. Therefore, in previous tunable metamaterial work with doped GaAs, the SRRs were designed to work at terahertz frequencies and the plasma frequency of the doped GaAs substrate matched this designed frequency, the resistance change of $R_d$ was the dominant mechanism that modified the resonance. See H.-T. Chen et al., "Active terahertz metamaterial devices," *Nature* 444, 597 (2006). Therefore, mainly an amplitude modulation of the resonance was observed, but a phase change was also possible.

For the mid-infrared tunable metamaterials of the present invention, the underlying semiconductor substrate preferably has a large dependence of dielectric function on the carrier concentration and the built-in semiconductor plasma resonance (set by material properties and carrier density) lies below the mid-infrared metamaterial operating range. The capacitance change (through a change in the real part of the dielectric function) becomes the dominant mechanism, resulting in a resonance shift instead of an amplitude modulation when the carrier concentration of the semiconductor substrate varies.

The resonance shift is determined by both the metamaterial geometry and the local dielectric environment. In the underlying semiconductor, the presence of free carriers can be described by the Drude model:

$$\varepsilon = \varepsilon_\infty\left[1 - \frac{\omega_p^2}{\omega^2 + i\omega\tau^{-1}}\right], \omega_p = \frac{4\pi Ne^2}{\varepsilon_\infty m^*}$$

where $\omega_p$ is the plasma frequency, N is the carrier concentration, $\varepsilon_\infty$ is the high frequency dielectric constant of the semiconductor, m* is the effective mass in the semiconductor, and $\tau$ is the scattering time. The model is based on treating electrons as damped harmonically bound particles subject to external electric fields. In general, any semiconductor that can achieve a plasma frequency near the desired metamaterial operating range with a damping constant on the order of the reciprocal operating frequency can be considered. The combination of low effective mass and high carrier concentration provides a high plasma frequency. The damping time in the semiconductor also impacts the amount of the effect that free carriers can have on the dielectric constant, where longer damping times lead to both greater tuning and lower losses. For operation near 10 μm wavelength, InSb-based semiconductors have a small electron effective mass and can produce useful effects with carrier concentrations on the order of $10^{18}$ cm$^{-3}$. However, the Drude formalism is universal such that the semiconductor can generally also comprise indium arsenide (InAs), gallium arsenide (GaAs), gallium antimonide (GaSb), and gallium nitride (GaN)-based compound semiconductors, as well as silicon-based semiconductors.

In order to provide a further tuning upon the application of a voltage, it is necessary to deplete this charged layer in an appropriate manner. Schottky contacts are difficult to implement at these doping levels and thus a metal-dielectric-semiconductor architecture can be used, very much like in an MOS transistor.

Various types of resonator elements can be used, including ring-like structures with one or multiple splits or wire-like structures in some connected arrangement, such as split-ring resonators (SRRs), cut-wire pairs (CWPs), or fishnet-like structures.

As an example of the present invention, InSb was used a substrate because it has a large dependence of dielectric function on doping levels, thereby enhancing this tuning effect through a change in the dielectric function of the substrate. This effect has been used previously for tunable subwavelength hole arrays, photonic crystals, etc. See B. S. Passmore et al., "Mid-infrared doping tunable transmission through subwavelength metal hole array on InSb," *Optics Express* 17, 10223 (2009); and W. Zawadski, "Electron transport phenomenon in small-gap semiconductors," *Advances in Physics* 23, 435 (1974). The exemplary mid-infrared tunable metamaterials were based on metallic split-ring resonators fabricated on doped InSb. Finite element simulations and measured transmission data showed that the resonance blue shifts when the semiconductor electron carrier concentration was increased while keeping the split ring geometry constant. A resonant wavelength shift of 1.15 μm was achieved by varying the carrier concentration of the underlying InSb epilayer from $1\times10^{16}$ $cm^{-3}$ to $2\times10^{18}$ $cm^{-3}$. Therefore, active tuning of metamaterials in the mid-infrared can be achieved using metallic metamaterial resonators fabricated on semiconductor substrates having a large dependence of dielectric function on carrier concentration (e.g., doped InSb).

Figure 2:
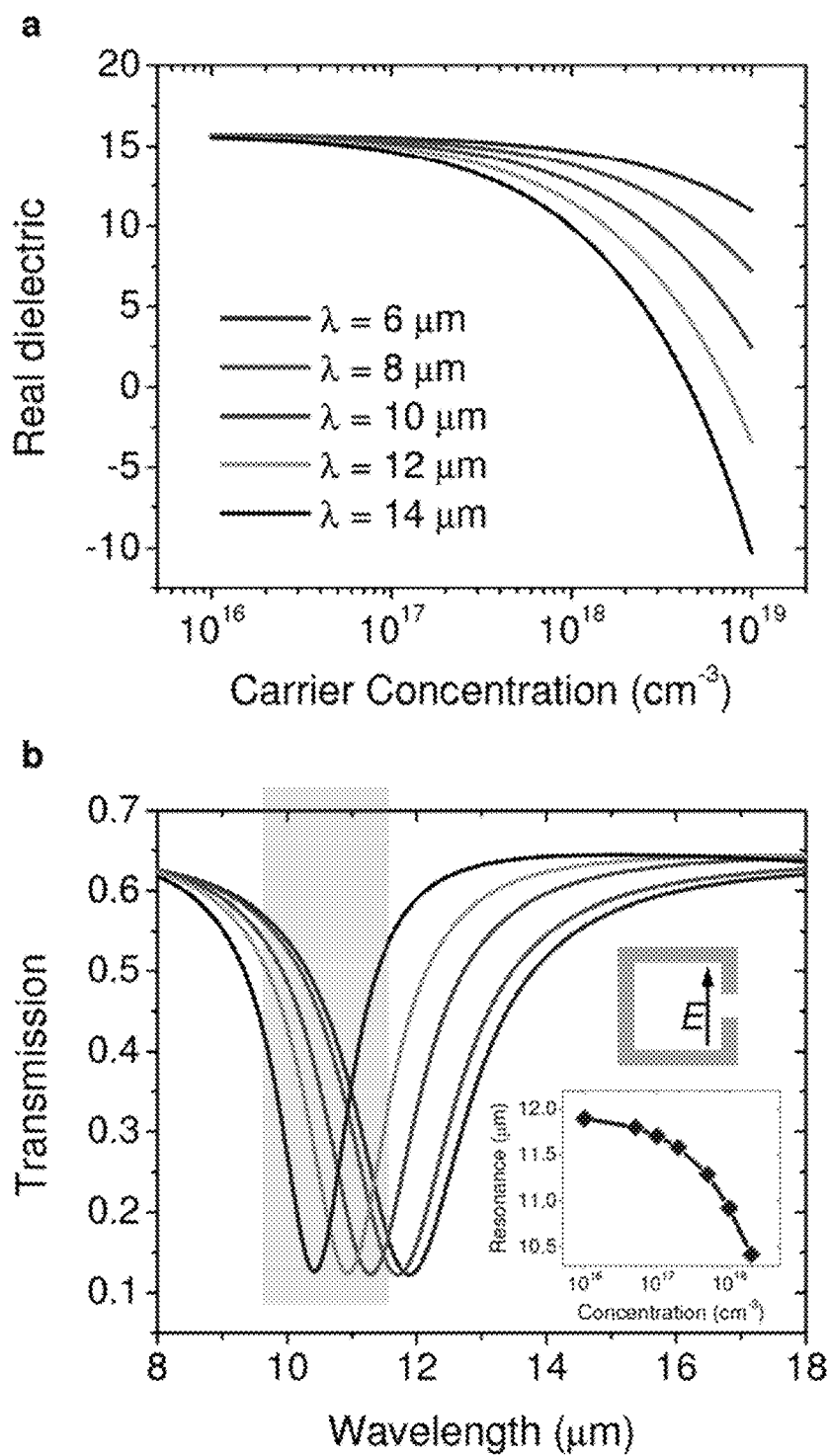
FIG. 2(a) is a graph of the real component of the complex dielectric function of indium antimonide (InSb) as a function of wavelength with different doping.
FIG. 2(b) is transmission spectra of SRRs on InSb substrates with different carrier concentration. The curves are the simulated transmission spectra of SRRs on an InSb substrate at carrier concentrations of $1 \times 10^{16}$ $cm^{-3}$, $1 \times 10^{17}$ $cm^{-3}$, $5 \times 10^{17}$ $cm^{-3}$, $1 \times 10^{18}$ $cm^{-3}$, and $2 \times 10^{18}$ $cm^{-3}$. The inset shows the resonance wavelength of metamaterial versus carrier concentration in the InSb substrate.

The real component of InSb's dielectric function at mid-infrared frequencies as a function of carrier concentration is displayed in FIG. 2(a). This was calculated from published data using the Drude model, which includes scattering and measured values for carrier concentration dependent mobility and effective mass. See J. Manzanares-Martinez et al., "Temperature tuning of two-dimensional photonic crystals in the presence of phonons and a plasma of electrons and holes," *Physical Review B* 72, 035336-1 (2005); and E. Litwin-Staszewska et al., "The electron mobility and thermoelectric power in InSb at atmosphere and hydrostatic pressures," *Physica Status Solidi (b)* 106, 551 (1981). As seen in this figure, the real part of InSb's dielectric function decreases as the carrier concentration increases and this trend becomes more significant at longer wavelengths. According to the LC circuit model, a decrease of the real component of the substrate's dielectric function will decrease the capacitance, and therefore shift the resonance to a higher frequency (i.e., a shorter wavelength).

A finite-element frequency domain solver was used to simulate the behavior of split-ring resonators on InSb substrates with varying carrier concentrations. The substrate comprised a 100-nm n-type doped layer grown on a semi-insulating InSb wafer. Gold SRRs were scaled from known designs such that the main resonance occurred at λ=10 μm (arm length of 660 nm, arm width of 130 nm, gap of 100 nm, and thickness of 80 nm). The computed wavelength dependent dielectric functions of InSb at different doping levels were used for the simulation. For the dielectric function of Au, a fitted Drude model based on ellipsometric data measured in the mid-infrared regime was used, with a plasma frequency of $1.27\times10^{16}$ rad/s and a collision frequency of 66 THz. A unit cell boundary condition was used to include the coupling effect between split-ring resonators, and the lattice constant between adjacent resonators was set as 1.34 μm.

FIG. 2(b) shows the simulated transmission spectra of metamaterials at normal incidence when the polarization direction of the excitation light was parallel to the gap as shown in the inset and the carrier concentration of the doped InSb layer was varied. The simulated metamaterial resonances (displayed as transmission minima) occur in the mid-infrared range. More importantly, the resonances shift monotonically from 11.9 μm to 10.4 μm when the carrier concentration increases from $1\times10^{16}$ $cm^{-3}$ to $2\times10^{18}$ $cm^{-3}$ (inset of FIG. 2(b)) due to a change in the bias voltage. Such resonance shifts are due to the differences in the dielectric functions of substrates when the carrier concentration in the doped layer varies as discussed above. There is very little change in the Q-factor of these resonances as the doping is varied, indicating that there is little effect of resistance shunting as observed at THz frequencies. See H.-T. Chen et al., "Active terahertz metamaterial devices," *Nature* 444, 597 (2006). Another way to look at the resonance shift is to study the transmission change at a specific wavelength. When the doping is varied from $2\times10^{18}$ $cm^{-3}$ to $1\times10^{16}$ $cm^{-3}$, the metamaterial transmission at 10.4 μm changes from 12% to 52%, which corresponds to a modulation depth of 62.5%. No resonance was observed in the simulated transmission spectra of metamaterials when the polarization direction of the excitation light was orthogonal to the gap, as expected.

Figure 3:
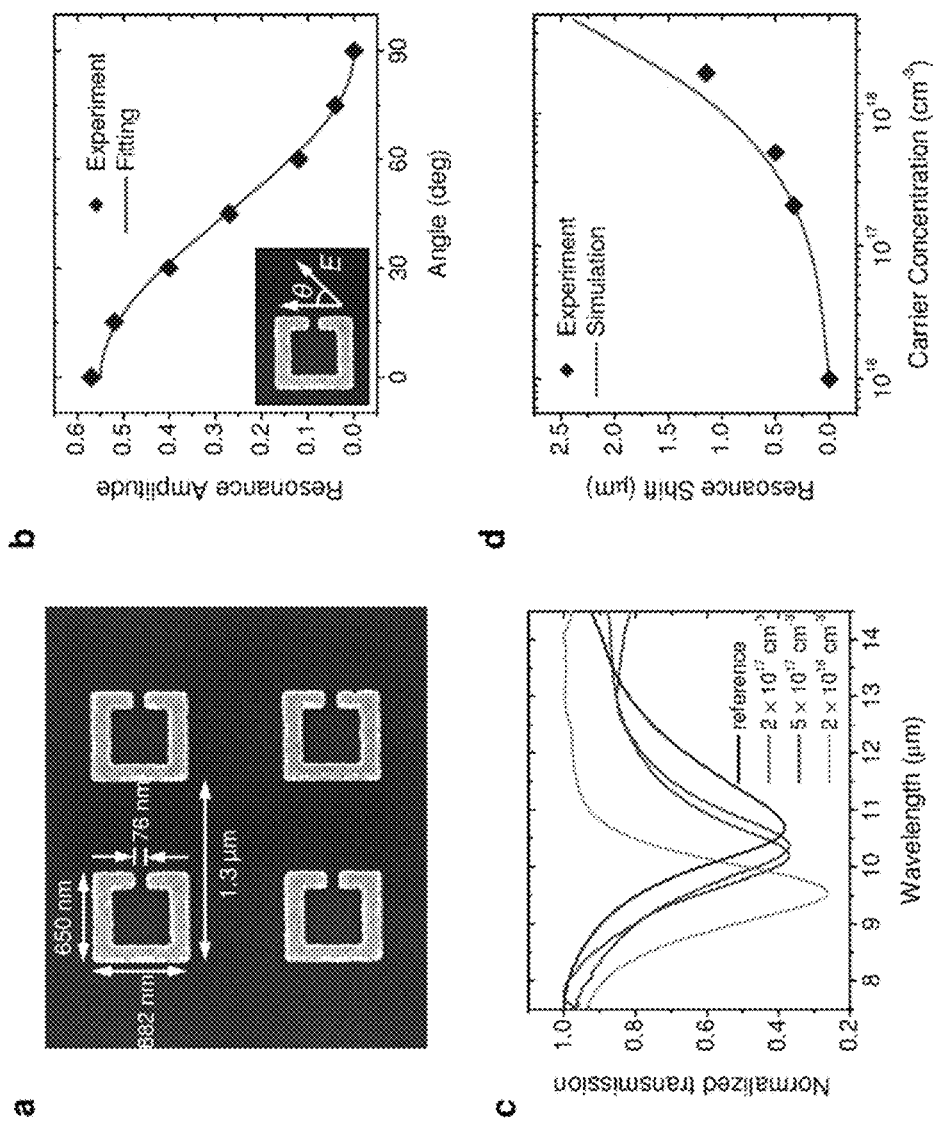
FIG. 3(a) is a scanning electron microscopic image of an array of SRRs fabricated on an InSb substrate.
FIG. 3(b) is a graph of the resonance amplitude of the SRR array fabricated on the InSb substrate at the doping level at $5\times10^{17}$ cm$^{-3}$ versus the intersection angle between incident light polarization direction and the gap of the split-ring resonator. The dots are the experimental measured values. The curve is a fit proportional to $\cos^2\theta$.
FIG. 3(c) is the transmission spectra for the metamaterial with SRRs fabricated on the reference InSb wafer, and the other three doped substrates. The polarization direction of the incident light is parallel to the SRR gap.
FIG. 3(d) is a graph of the resonance shift when the carrier concentration is increased from the intrinsic level. The curve shows the results from a finite element simulation. The dots are the experimentally measured values.

For the experimental study, metamaterial samples were fabricated on four different InSb substrates. One of the substrates, a (111) lightly doped InSb wafer without the doped epilayer, was chosen as a reference. The other three substrates consisted of a thin n-type doped layer grown on the reference wafer by molecular beam epitaxy. The thicknesses of the doped layers in the three substrates were 150 nm, 150 nm, and 750 nm, respectively. The corresponding carrier concentrations of the doped layers were $2\times10^{17}$ $cm^{-3}$, $5\times10^{17}$ $cm^{-3}$, and $2\times10^{18}$ $cm^{-3}$. The carrier concentrations were determined from doped InSb layers grown on SI-GaAs substrates by Hall measurements using the van der Pauw method at room temperature. The split-ring resonators were patterned on InSb substrates using standard nanofabrication techniques including electron-beam lithography, metal deposition, and lift-off. The metamaterial elements were patterned with a period of 1.34 μm to form a planar array of 2×2 $mm^2$. The sample was spin coated with polymethyl-methacrylate and baked at 170 degree for 30 minutes. The split-ring structures were exposed using an electron beam lithography system operating at 100 kV and 1 nA beam current. The dose used for the small structures was around 1000 μC/$cm^2$. Electron beam evaporation was used to deposit 100 Å and 700 Å of Ti and Au, respectively. Lift-off was conducted in an acetone bath. A representative scanning electron microscope image of a split-ring resonator is shown in FIG. 3(a). To minimize the scattering from surface roughness during the transmission measurement, the backside of the samples was polished using a grinder-polisher.

Transmission spectra of the fabricated metamaterials were measured using a Fourier-transform infrared spectrometer. Samples were analyzed at room temperature using a liquid-nitrogen cooled mercury cadmium telluride detector. A spectral resolution of 1 $cm^{-1}$ was used and the data were averaged over 100 scans. An polarizer was placed in front of the sample so that polarization-dependent transmission could be recorded from θ=0 to 90 degrees in an increment of 15 degrees, where θ is the intersection angle between incident light polarization direction and the gap of the split-ring resonator (i.e., θ=0 degree represents a polarization direction parallel to the gap; θ=90 degree represents a polarization direction orthogonal to the gap). FIG. 3(b) shows the amplitude of the resonance at different intersection angles (measured on the sample with a carrier concentration of $5\times10^{17}$ $cm^{-3}$) and reveals that the amplitude of the resonance varies as $cos^2$ θ, which represents the projection of the excited light intensity in the direction parallel to the gap. Such polarization dependence is consistent with the simulation results as discussed above and is indicative of excitation of the LC resonance of SRRs.

The position of the LC resonance is found to be strongly dependent on the carrier concentration of the semiconductor substrate. FIG. 3(c) shows the normalized transmission spectra of the four metamaterial samples used in this study. Each spectrum was taken with incident light polarization parallel to the gap. A clear blue shift of the transmission peak is seen as the doping level of the InSb substrate is increased. The experimentally observed trend of the metamaterial resonance as a function of substrate doping is consistent with both the LC circuit model analysis as well as the finite element simulation. This trend is plotted in FIG. 3(d) together with the simulation results. As shown, the experimentally observed shift is in very good agreement with the results from finite element simulations. The slight difference may be attributed to a number of factors, including the varying thickness of the doped layers and an uncertainty in the measured carrier concentrations.

Figure 4:
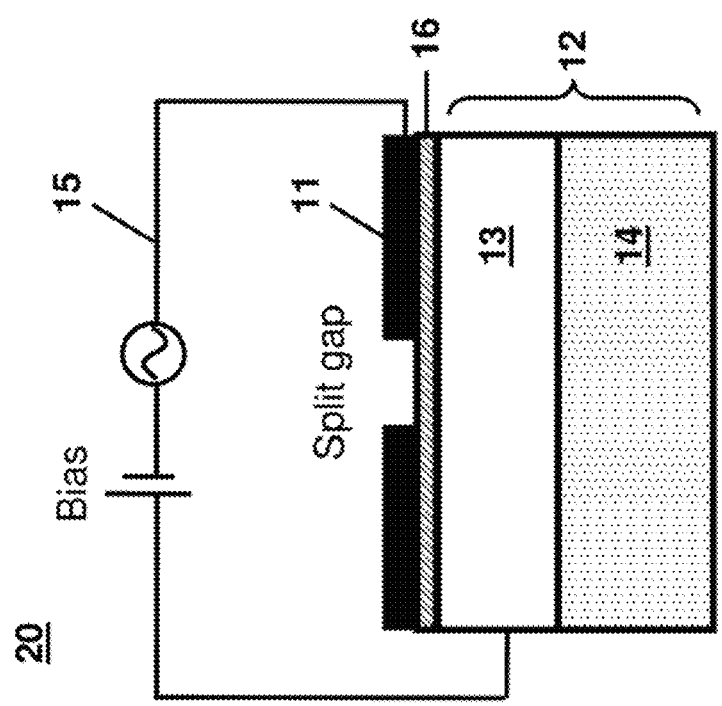
FIG. 4 is a side-view schematic illustration of an electrically tunable metamaterial that uses a gate dielectric.

As shown in FIG. 1, the carrier concentration can be modified by applying a voltage bias between a metallic Schottky gate connected to the array of resonator elements and an ohmic contact to the semiconductor substrate. A potential concern when using InSb as a substrate is the electron tunneling between gold SRRs and InSb substrate when a high doping level is used. Therefore, a metal-oxide-semiconductor (MOS) capacitor can be used as the gated device instead of the simple metal-semiconductor (Schottky) contact. FIG. 4 is a side-view schematic illustration of an electrically tunable metamaterial 20 that uses a gate dielectric 16 between the resonator 11 and the semiconductor substrate 12. In general, the thickness of the dielectric needs to be thin enough such that fields from the metamaterial resonator can still penetrate into the underlying semiconductor material. However, even when the gate dielectric is very thin, a very small absorption at the frequency of operation (i.e., where the metamaterials have their resonances) is effectively amplified by the Q of the metamaterial resonator. See D. J. Shelton et al., "Effect of thin silicon dioxide layers on the resonant frequency in infrared metamaterials," *Optics Express* 18 (2), 1085 (2010). This can have a significant degradation of the Q and thus the performance of such resonances. For example, in the thermal infrared, $HfO_2$ can be used as the gate dielectric, since its mid-infrared absorption is very low. For shorter infrared wavelengths, (e.g., less than 7 µm), $SiO_2$ can be used as the gate dielectric. Alternatively, heterostructures (AlInSb/InSb) can be used instead of InSb to achieve the gate isolation.

The present invention has been described as a tunable mid-infrared metamaterial. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A metamaterial tunable within an operating frequency range, comprising:
   a doped indium antimonide substrate having a large dependence of dielectric function on the carrier concentration and a semiconductor plasma resonance lying below the operating frequency range;
   an array of resonators on the doped indium antimonide substrate;
   a gate dielectric layer between the resonator array and the doped indium antimonide substrate; and
   an electrical circuit adapted to apply a bias voltage between the doped indium antimonide substrate and the resonator array for modulating the carrier concentration of the indium antimonide substrate and tuning the resonance of the resonator array over the operating frequency range;
   wherein the resonator array is tunable over an operating frequency range of 100 THz to 15 THz (wavelength range of 3 20 µm).

2. The metamaterial of claim 1, wherein the indium antimonide substrate is doped n-type.

3. The metamaterial of claim 2, wherein the doping concentration is $1 \times 10^{16}$ $cm^{-3}$ to $5 \times 10^{18}$ $cm^{-3}$.

4. The metamaterial of claim 1, wherein the doped indium antimonide substrate comprises a doped layer on a semi-insulating substrate.

5. The metamaterial of claim 1, wherein the resonator array comprises a ring-like structure with one or multiple splits or a wire-like structure in a connected arrangement.

6. The metamaterial of claim 5, wherein the resonator array comprises a split-ring resonator, a cut-wire pair, or a fishnet-like structure.

7. The metamaterial of claim 1, wherein the gate dielectric layer comprises $HfO_2$.

8. The metamaterial of claim 1, wherein the gate dielectric layer comprises $SiO_2$ and wherein the resonator array is tunable over an operating frequency range of 100 THz to 43 THz (wavelength range of 3-7 µm).

9. The metamaterial of claim 1, wherein the resonator array is tunable over an operating frequency range of 37.5 THz to 25 THz (wavelength range of 8-12 µm).

* * * * *